United States Patent [19]

Mochizuki et al.

[11] Patent Number: 4,866,517
[45] Date of Patent: Sep. 12, 1989

[54] LASER PLASMA X-RAY GENERATOR CAPABLE OF CONTINUOUSLY GENERATING X-RAYS

[75] Inventors: Takayasu Mochizuki, Tokyo; Chiyoe Yamanaka, 11-1, Nishiyama-cho, Ashiya-shi, Hyogo-ken, both of Japan

[73] Assignees: Hoya Corp., Tokyo; Chiyoe Yamanaka, Hyogo, both of Japan

[21] Appl. No.: 95,414

[22] Filed: Sep. 10, 1987

[30] Foreign Application Priority Data

Sep. 11, 1986 [JP] Japan ................................ 61-214734

[51] Int. Cl.$^4$ ............................................. H05H 1/24
[52] U.S. Cl. .................................... 378/119; 378/120; 378/160
[58] Field of Search .................. 378/119, 120, 34, 160

[56] References Cited

U.S. PATENT DOCUMENTS 4,408,338 10/1983 Grobman ............................ 378/119
4,700,371 10/1987 Forsyth et al. ........................ 378/34
4,723,262 2/1988 Noda et al. .......................... 378/119

Primary Examiner—Carolyn E. Fields
Assistant Examiner—David P. Porta
Attorney, Agent, or Firm—Roberts, Spiecens & Cohen

[57] ABSTRACT

In a laser plasma X-ray device for use in generating X-rays by bombarding a target material by a pulsed laser beam, the target material is selected from materials which are in a gas phase at the room temperature and which are cooled in a selected one of liquid and solid phases. Such a selected phase of the target material is continuously supplied to a focal point of the pulsed laser beam to be subjected to bombardment and to generate the X-rays. On generation of the X-rays, the target material is rendered into the gas phase to be recycled into the selected phase. The X-rays are guided outside of the chamber through an X-ray gate unit opened in synchronism with a repetition frequency of the pulsed laser beam.

12 Claims, 3 Drawing Sheets

LASER PLASMA X-RAY GENERATOR CAPABLE OF CONTINUOUSLY GENERATING X-RAYS

BACKGROUND OF THE INVENTION:

This invention relate to a laser plasma X-ray generator which is mainly used as an X-ray source for X-ray lithography, X-ray microscopy, and the like.

In a conventional laser plasma X-ray generator of the type described, X-rays are generated by emitting a pulsed laser beam of high power onto a target placed in a chamber and by producing plasma due to emission of the target by the pulsed laser beam. Such plasma has a high temperature and a high density. The chamber is usually kept at a low pressure in comparison with ambient pressure.

It is common that the target is formed by a target material in a solid-state and may be called a solid-state target. For X-ray lithography or the like, it is preferable that energy of X-rays is between 0.1 keV and 3 keV. Taking this into account, either copper or aluminum is frequently used as the target material. Such a target of a metal is subjected to emission or bombardment of the pulsed laser beam. In this event, the pulsed laser beam is focused on a focal point to bombard the target at the focal point and to generate the X-rays. As a result of bombardment of the pulsed laser beam onto the target, evaporation of the target material takes place at and near the focal point and undersirably roughens the surface of the target with a crater. Such roughness of the target makes convergence of the pulsed laser beam objectionably unstable on the target surface. Accordingly, the pulsed laser beam must always converge onto a pure or unbombarded surface of the target. To this end, the target is formed into a conical or a cylindrical shape and is rotated around an axis of the target.

In addition, the X-rays are derived from the chamber through an outlet portion which comprises a thin film of, for example, beryllium which is attached to an outlet and which has a good transmissivity to the X-rays.

As is readily understood from the above, the solid-state target is eventually worn out and can not be reused. This means that a new solid-state target must be exchanged for a used one after a predetermined time of, for example, one hour. Such exchange of the solid-state target is troublesome and results in interruption of operation or processing carried out by the use of the laser plasma X-ray generator.

Consideration might be made about automatic exchange of the solid-state target. However, the automatic exchange makes the laser plasma X-ray generator undersirably large in size and brings about an increase of an expense for faulties.

Moreover, the target material is evaporated during the emission of the pulsed laser beam onto the solid-state target, as mentioned before. Such evaporation results in deposition of the target material onto an internal wall surface of the chamber and the thin film of the outlet portion. The deposition of the target material on the thin film reduces the transmissivity of the X-rays and objectionably attenuates an intensity of the X-rays. Therefore, use of the solid-state target makes it difficult to keep the X-rays stable in intensity.

In addition, it should be considered that the X-rays are also inevitably attenuated by the thin film of beryllium or the like attached to the outlet, although the beryllium itself exhibits a good transmissivity to the X-rays. It is mentioned here that the thin film must be thick when a difference of pressures is large between an inside and an outside of the chamber and when an area of the outlet is wide. Under the circumstances, the attenuation of the X-rays becomes serious due to the thin film with an increase of thickness of the thin film.

In order to avoid the attenuation of the X-rays, the outlet might be opened at the outlet portion with the thin film removed. However, this makes it difficult to keep the chamber at a predetermined degree of vacuum and brings about leakage of a vapored target material. Such a vapored target material might be deposited onto an object, such as an X-ray mask, to be processed by the X-rays. As a result, the object might be mechanically destructed or degraded in its characteristics.

In Unexamined Japanese Patent Publication No. Syô 60-7130, namely, 7130/1985, proposal is made as regards a device wherein an object, such as a mask, a substrate with a resist layer, is located within a vacuum chamber to avoid attenuation of X-rays. However, undesirable deposition of a vapored target material onto the object and the resultant destruction of the object can not be avoided in the proposed device.

In Unexamined Japanese Patent Publication No. Syô 58-225636, namely, 225636/1983, an X-ray emission device is disclosed which comprises a first chamber kept at a high degree of vacuum, a second chamber filled with a helium gas having a low X-ray attenuation factor, and an intermediate chamber between the first and the second chambers. X-rays are generated in the first chamber by bombarding a solid-state target by a pulsed laser beam and is guided through the intermediate chamber to the second chamber. The second chamber is kept at a pressure substantially equal to the ambient pressure and serves to allow the X-rays to pass through an outlet. With this structure, it is possible to make a thickness of a film on the outlet considerably thin and to widen an area irradiated by the X-rays. However, maintenance of a high degree of vacuum in the first chamber encounters with a difficulty because the first chamber which must be kept at a high degree of vacuum is associated with the second chamber of a high pressure through the intermediate chamber. In addition, attenuation of the X-rays is unavoidable due to the helium gas filled in the second chamber, which might cancel an effect of making the film thin.

In order to avoid undersirable deposition of a target material, a radio frequency (RF) oscillation coil is disposed outside of a chamber in Unexamined Japanese Patent Publication No. Syô 58-40757, namely, 40757/1983. Specifically, the RF oscillation coil is energized with a gas of, for example, chlorine filled in the chamber. The gas is rendered into plasma by energization of the RF oscillation coil. A deposited target material, such as aluminum, is gasified by the plasma into a predetermined gas, which may become $Al_2Cl_3$ according to the description.

In this event, it is necessary to introduce the gas into the chamber and to cause the plasma to occur in the chamber each time on deposition of the target material. Such an operation for removing the undesirable deposition is very combersome and inevitably suspends a continuos run of operation.

Furthermore, a device is disclosed in Unexamined Japanese Patent Publication No. Syô 58-158842, namely, 158842/1983, and uses a target formed by a target material such that a product which appears after occurrence of plasma is in a gas phase. Such a product may take place as a result of either reaction of the product with an atmosphere or dissolution of the product itself. Such a target material may be ice, an solid phase of ammonia, dry ice, or the like. At any rate, the target is in a solid-state before occurrence of the plasma. With this structure, it is possible to avoid deposition of the target material or a chamber.

However, the target material must be replaced by another one after it is worn out. In other words, it is difficult to continuously introduce the target material into the chamber and to continuously generate the X-rays for a long time without any interruptions. In addition, no suggestion is made about avoiding attenuation of the X-rays which occurs at an outlet portion.

SUMMARY OF THE INVENTION

It is an object of this invention to provide a laser plasma X-ray generator which can generate X-rays for a long time without any interruption.

It is another object of this invention to provide a laser plasma X-ray generator of the type described, which is capable of avoiding undesirable deposition of a target material on a chamber.

It is a further object of this invention to provide a laser plasma X-ray generator of the type described, which can avoid attenuation of X-rays due to deposition of the target material on an outlet portion.

It is still another object of this invention to provide a laser plasma X-ray generator of the type described, wherein it is possible to prevent undersirable leakage of X-rays.

It is yet another object of this invention to provide a laser plasma X-ray generator of the type described, which can keep a degree of vacuum substantially invariable in the chamber.

It is another object of this invention to provide a laser plasma X-ray generator of the type described, wherein an object to be processed can be protected from destruction which might occur due to leakage of the X-rays.

According to an aspect of this invention, there is provided a laser plasma X-ray generator which comprises an evacuative chamber having a laser inlet portion and an X-ray outlet portion and defining a hollow space in the chamber, laser emitting means for emitting a pulsed laser beam of a predetermined repetition frequency into the hollow space through the laser inlet portion so that the pulsed laser beam converges at a focal point predetermined within the hollow space, and target material supplying means for continuously supplying a target material into the hollow space. The target material is in a selected one of a liquid phase and a solid phase that is evaporable by emission of the pulsed laser beam to generate X-rays. The generator further comprises conveying means placed within the hollow space for continuously conveying the target material through the focal point and gating means adjacent to the X-ray outlet portion for gating the X-ray outlet portion is synchronism with the predetermined repetition frequency of the pulsed laser beam to introduce the X-rays outside of the hollow space.

According to another aspect of this invention, there is provided an X-ray gating member or unit which is for use in gating X-rays which are produced by bombarding a target material in an evacuative chamber by the use of a succession of laser pulses each of which has a predetermined pulse width and a predetermined repetition frequency and which exits through an X-ray outlet portion formed in the evacuative chamber. The X-ray gating member comprises a first disk member having at least one first through hole, a second disk member having at least one second through hole which is related in number to the first through hole, a first axle member for rotatably supporting the first disk member so that the first through hole periodically faces the X-ray outlet portion, a second axle member for rotatably supporting the second disk member with the first and the second disk members partially superposed on each other to periodically register the second through hole with the first through hole, first driving means coupled to the first axle member for driving the first axle member to rotate the first disk member at a first speed of rotation, second driving means coupled to the second axle member for driving the second axle member to rotate the second disk member at a second speed of rotation which is selected so that a difference between the first and the second speeds of rotation is substantially equal to the predetermined repetition frequency, the first and the second through holes being thereby periodically opened relative to the X-ray outlet portion in synchronism with generation of the X-ray.

Figure 1:
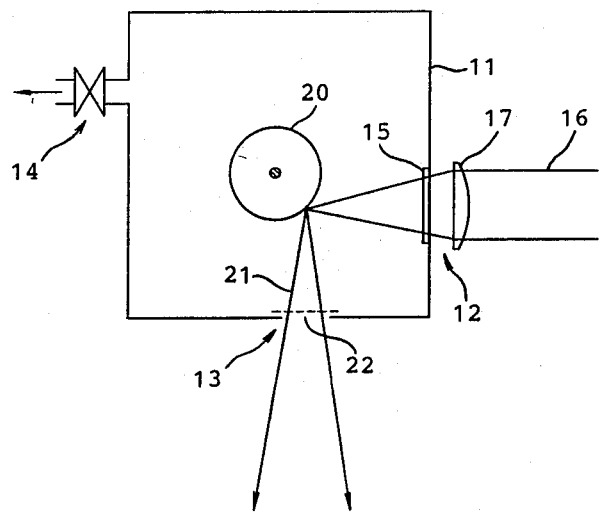
FIG. 1 is a schematic view of a conventional laser plasma X-ray device.

DESCRIPTION OF THE PREFERRED EMBODIMENTS:

Referring to FIG. 1, a conventional laser plasma X-ray device comprises a vacuum chamber 11 defining a hollow space and having a laser inlet portion 12 and an X-ray outlet portion 13. The vacuum chamber 11 is evacuated to a predetermined degree of vacuum through a valve 14 by a vacuum pump (not shown). A window plate 15 is fixed to the chamber 11 at the laser input portion 12. A pulsed laser beam 16 is generated by a laser source (not shown) and is incident onto the window plate 15 through an optical system 17. The pulsed laser beam 16 is a succession of laser pulses.

A solid-state target 20 of a target material, as of metal, is disposed within the hollow space of the chamber 11 and is formed into a rotationally symmetric shape which has an axis of rotation and which may be cylindrical or conical. In this event, the pulsed laser beam 16 is focused on the solid-state target 20 so that the pulsed laser beam 16 has a focal point on the cylindrical or conical surface of the solid-state target 20.

When the solid-state target 20 is bombarded by the pulsed laser beam 16 in the chamber 11 kept at the predetermined degree of vacuum, the target material is rendered into plasma and, as a result, generation of X-rays takes place. The X-rays are emitted from the chamber 11 through a thin film of, for example, beryllium placed in the X-ray outlet portion 13.

With this structure, it is possible to stably focus the pulsed laser beam 16 onto the surface of the solid-state target 20 and to readily keep the chamber 11 at the predetermined degree of vacuum. Therefore, the illustrated X-ray device is practically very useful.

However, the X-ray device has a lot of disadvantages as pointed out in the preamble of the present specification.

Figure 2:
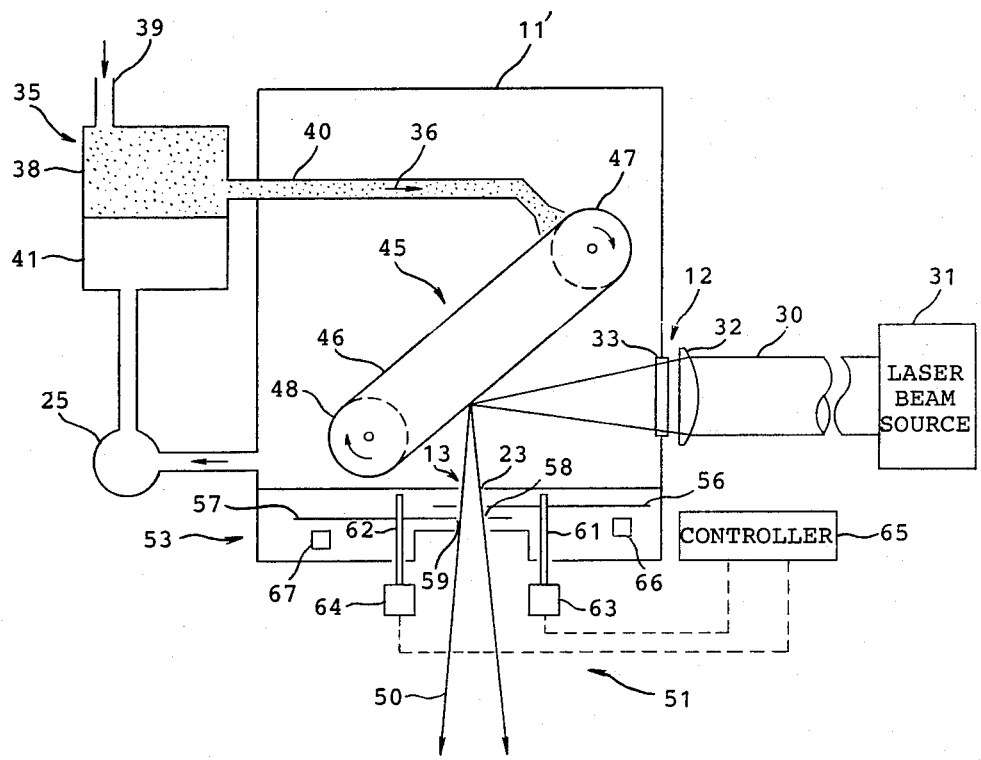
FIG. 2 is a view of a laser plasma X-ray device according to a first embodiment of this invention.

Referring to FIG. 2, a laser plasma X-ray device according to a first embodiment of this invention comprises a metallic chamber 11' defining a hollow space. Like in FIG. 1, the chamber 11' has a laser inlet portion 12 having a window plate 15 fitted to a side surface of the chamber 11'. It is to be noted here that an X-ray outlet portion 13 is opened without any thin film 22 as shown in FIG. 1 but serves to substantially keep the hollow space at a predetermined degree of vacuum, as will later be described. In this connection, the X-ray outlet portion 13 has an outlet or passage 23 formed on a front wall of the chamber 11' without any thin film. The hollow space in the chamber 11' is evacuated by the use of an exhausting unit 25 to a predetermined degree of vacuum which may be less than 10 Torr.

A pulsed laser beam 30 is emitted from a laser beam source 31 and is introduced into the hollow space through an optical system 32 and a window plate 33 of the laser inlet portion 12. Preferably, the laser beam source 31 has an output of 10 Watts and produces the pulsed laser beam 30 focused by the optical system 32 on a focal point placed in the hollow space. A combination of the laser beam source 31 and the optical system 32 may be called a laser emitting section for emitting the pulsed laser beam 30 into the hollow space of the chamber 11'.

The pulsed laser beam 30 is composed of a succession of laser pulses having a predetermined wavelength, predetermined output power, a predetermined pulse width, and a predetermined repetition frequency, all of which are selected in consideration of photon energy of X-rays generated by the X-ray device. Preferably, the pulse width and the repetition frequency are between 10 and 0.1 nanoseconds and between 10 and 1000 Hz, respectively. The laser beam source 31 may have an output not lower than 10 Watts. In the example being illustrated, the predetermined wavelength, output power, pulse width, and repetition frequency are selected at 0.53 micron meter, about 50 Watts, 0.1 nanosecond, and 100 Hz, respectively, so as to generate the X-rays having the photon energy between 0.1 and 0.3 keV. In this event, the pulsed laser beam 30 had a spot size diameter between 100 and 500 micron meters and an optical intensity of $10^{13}$ Watts/cm$^2$ at the focal point.

A target material supply unit 35 is coupled to the hollow space in order to supply a target material 36 into the hollow space. Herein, it is to be noted that the target material 36 is given in the form of either a liquid phase or a solid phase of a natural or genuine material which is chemically inert and which is in a gas phase at a room temperature. The gas phase, as herein called, may be whichever of the gas phase in the narrow sense and a vapour phase. In the illustrated example, the target material 36 is assumed to be in the liquid phase. Specifically, the natural material may be readily gasified at a temperature equal to or higher than minus 50° C. and may have a liquefying point and a solidifying point both of which are lower than minus 50° C. According to the inventors' experimental studies, it has been found out that the natural material may be, for example, krypton, xenon, argon, or the like. Anyway, the natural material may be selected from a group consisting of rare gases and inert gases as will become clear as the description proceeds.

The illustrated target material supply unit 35 is also coupled to the exhausting unit 25 to recycle the target material in a manner to be described later in detail.

The target material supply unit 35 comprises a reservoir 38 placed outside of the chamber 11' to stock and comprises the target material 36 given through an incoming port 39 and a conduit 40 extended through another side wall of the chamber 11' into the hollow space. A cooling unit 41 is coupled to the reservoir 38 to cool or refrigerate the target material 36 to a temperature less than the liquefying temperature of the target material 36. The illustrated cooling unit 41 serves to recover the target material exhausted from the chamber 11' through the exhausting unit 25. In this connection, the target material supplied through the incoming port 35b may be in the gas phase.

The target material 36 of the liquid phase is conducted through the conduit 40 into an open end of the conduit 40 and dropped through the open end onto a conveyor unit 45 located in the hollow space.

The conveyor unit 45 is operable to continuously convey the target material 36 to the focal point of the pulsed laser beam 30. The conveyor unit 45 comprises an endless belt 46 supported and carried on a pair of rolls 47 and 48 spaced apart from each other. Either one of the rolls 47 and 48 is driven or rotated by a motor (not shown) at a predetermined speed in a direction illustrated by an arrowhead while the other acts as an idler roll. Thus, the rolls 47 and 48 serve as a driving member for driving the endless belt 46. The endless belt 46 and the rolls 47 and 48 are positioned in the hollow space so that the endless belt 46 passes through the focal point of the pulsed laser beam 30.

When the target material 36 of the liquid phase is dropped on the endless belt 46 and is successively solidified or frozen on the endless belt 46 into a mass of the target material which is adhered to the endless belt 46. The mass of the target material is cooled as mentioned above and may therefore be referred to as a cryo-target. In any event, the mass of the target material is successively conveyed to the focal point to be subjected to emission or bombardment of the pulsed laser beam 30. Thus, the endless belt 46 is operable to continuously transfer the mass of the target material to the focal point.

When the mass of the target material, namely, the cryo-target is bombarded by the pulsed laser beam 30 at the focal point, it is found out that plasma appears from the cryo-target in the hollow space and brings about occurrence of X-rays which have photon energy available for the X-ray lithography. In particular, it has been found out that the photon energy of the X-rays falls within a range which is between 1.0 and 3.0 keV and which is optimum for the X-ray lithography, when kryton, xenon, or argon is used as the target material.

The X-rays are guided through the outlet 23 and a gating unit 50 which will later be described in detail.

Figure 3:
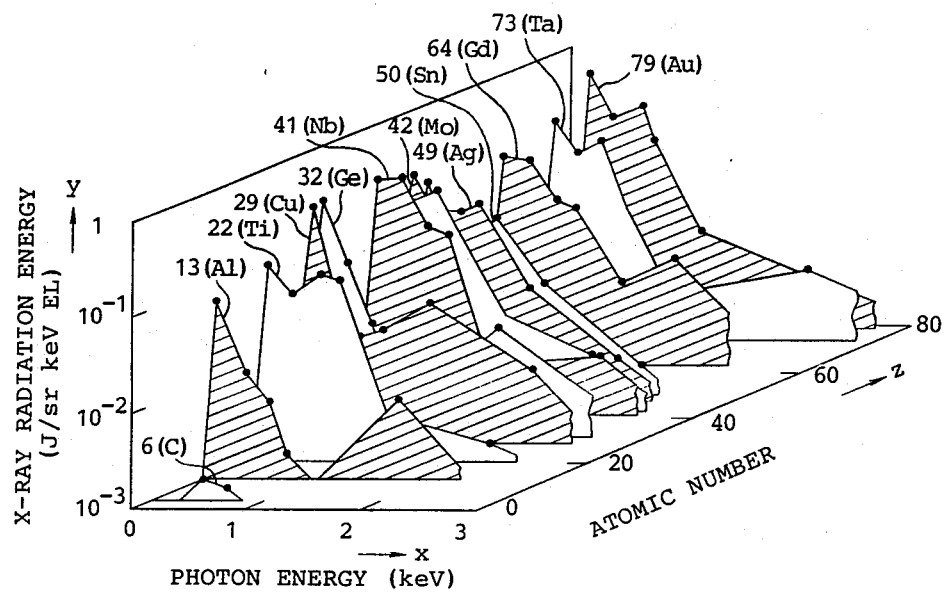
FIG. 3 is a graphical representation for use in describing a relationship among photon energy, X-ray radiation energy, and atomic numbers so as to estimate the above-mentioned relationship in a target material according to this invention.

Temporarily referring to FIGS. 3 and 4, consideration will be made as regards X-rays generated from the above-mentioned cryo-target. In FIG. 3, a three-dimensional coordinate is illustrated which has an x-axis representative of photon energy (keV) of the X-rays, a y-axis representative of X-ray radiation energy (Joule/Sr.keV $E_L$), and a z-axis representative of the atomic number, where Sr represents a solid angle of the X-rays in steradian, and $E_L$ represents laser energy. The X-ray radiation energy may be regarded as conversion efficiency between a pulsed laser beam and the X-rays while the photon energy may be regarded as an X-ray spectrum.

The X-ray radiation energy is measured about various kinds of materials, such as carbon (C), aluminum (Al), titanium (Ti), copper (Cu), germanium (Ge), neodymium (Nb), molybdenum (Mo), silver (Ag), tin (Sn), gadolinium (Gd), tantalum (Ta), and gold (Au) which have the atomic numbers 6, 13, 22, 29, 32, 41, 42, 49, 50, 64, 73, and 79, respectively.

As shown in FIG. 3, the exemplified materials exhibit maximum X-ray radiation energy, namely, maximum conversion efficiency within a range of the photon energy between 0.1 and 3 keV. For example, the carbon exhibits the maximum conversion efficiency within the range of the photon energy between 0.1 and 0.5 keV while the gadolinium has the maximum conversion efficiency within another range of the photon energy between 1.3 and 2.0 keV.

Figure 4:
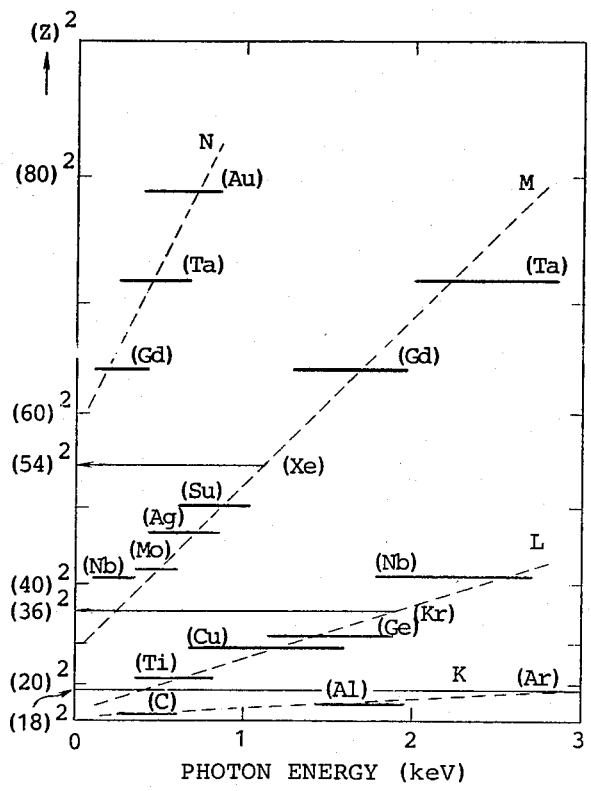
FIG. 4 is another graphical representation for use in describing dependency of photon energy on the atomic number to estimate the target material according to this invention.

In FIG. 4, illustration is made about a relationship between the photon energy (keV) taken along an abscissa and a square of the atomic number taken along the z-axis. The enumerated materials have high conversion efficiency zones, as shown by solid lines in FIG. 4. For example, the high conversion efficiency zones of aluminum, germanium, tin, and gadolinium resides between 1.5 and 2.0 keV, between 1.4 and 2.1 keV, between 0.6 and 1.1 keV, and between 0.2 and 0.5 keV, respectively.

In addition, the high conversion efficiency zones are classified and can be supposed in consideration of electron orbits of the atom. More particularly, classification is possible by considering groups which have K-shell, L-shell, M-shell, and N-shell of the electron orbits and each of which has the high conversion efficiency zone distributed along a broken line determined for each shell. Such high conversion efficiency zones become high in photon energy with an increase of the square of the atomic number, as known by Moseley's law.

Under the circumstances, it is readily possible to determine high conversion efficiency zones of argon, krypton, and xenon, as indicated in FIG. 4. Accordingly, the target material can be selected with reference to high conversion efficiency zones necessary for the X-ray lithography and X-ray microscopy.

Referring back to FIG. 2, the X-rays 50 which are generated in the hollow space in the above-mentioned manner are guided through the outlet 23 of the chamber 11' outside of the chamber 11'. On generation of the X-rays, the cryo-target is returned back to the natural material, namely, gas phase because the cryo-target is heated by bombardment of the pulsed laser beam 30 to a temperature higher than the liquefying temperature of the target material. The natural material is evacuated by the exhausting unit 25 to be sent back to the cooling unit 41 and to be compressed within the cooling unit 41. As a result of compression, the natural material of the gas phase is changed to the target material of the liquid phase. Thus, the target material 36 is successively recycled through the exhausting unit 25 and the cooling unit 41 into the reservoir 38. Therefore, it is possible to continuously operate the X-ray device by only compensating the target material of the gas phase through the incoming port 39.

In addition, the target material 36 is in the gas phase at the room temperature and is therefore never deposited on a wall of the chamber 11'. From this fact, it is seen that no contamination occurs on the wall of the chamber 11' and that a thin film of, for example, beryllium may be therefore attached to the outlet 23.

However, attenuation of the X-rays 50 inevitably appears by the use of the thin film, as pointed out in the preamble of the instant specification.

Figure 5:
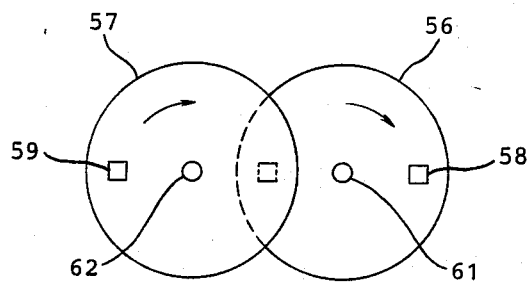
FIG. 5 is a plan view of an X-ray gate unit used in the laser plasma X-ray device illustrated in FIG. 2.

Referring to FIG. 5 afresh and FIG. 2 again, an X-ray gate unit 51 is placed outside of the chamber 11' in the vicinity of the outlet 23 formed in the chamber 11', with a gap left between the chamber 11' and the X-ray gate unit 51. The gap may be, for example, 1 mm long. The X-ray gate unit 51 is intermittently opened in synchronism with the pulsed laser beam 30 to expose the outlet 23 to the atmosphere. As a result, the X-ray gate unit 51 serves to make the X-rays 50 exit from the chamber 11' and may be called an X-ray exit member.

The illustrated X-ray gate unit 51 is partially accommodated in an additional chamber 53 attached to the chamber 11' and comprises first and second disk members 56 and 57 both of which are partially superposed on each other, as illustrated in FIG. 5 and which are rotatable around axes of rotation. The first and the second disk members 56 and 57 juxtaposed with each other with a slight interval left therebetween and have first and second through holes 58 and 59 which are spaced apart from the axes of rotation and each of which is, for example, 1 cm$^2$ in area. Distances between the axes of rotation and the through holes 58 and 59 may be between 5 cm and 10 cm.

The first and the second disk members 56 and 57 are rotatably supported at the axes of rotation by first and second axle members 61 and 62, respectively. The first and the second axle members 61 and 62 are located in parallel with a spacing left between the first and the second axle members 58 and 59. Such a spacing is selected so that the first and the second through holes 58 and 59 are registered with each other when the first disk member 56 is superposed on the second disk member 57. Consequently, the first and the second through holes 58 and 59 are periodically aligned with the outlet 23, as shown in FIGS. 2 and 5, when the first and the second disk members 56 and 57 are rotated as indicated at arrowheads in FIG. 5.

The first and the second axle members 56 and 57 are driven by first and second motors 63 and 64 so as to rotate the first and the second disk members 56 and 57 at first and second speeds of rotation, respectively. The first and the second speeds of rotation may be regarded as first and second rotational frequencies f1 and f2, respectively, in consideration of the repetition frequency of the pulsed laser beam 30.

In the example being illustrated, it is assumed that the first and the second rotational frequencies f1 and f2 are equal to 600 Hz and 500 Hz, respectively, when the pulsed laser beam 30 has the repetition frequency of 100 Hz. In other words, the first and the second rotational frequencies f1 and f2 are decided so that an absolute value of a difference V between the first and the second rotational frequencies f1 and f2 becomes equal to the repetition frequency of the pulsed laser beam 30. In order to rotate the first and the second disk members 56 and 57 at the first and the second rotational frequencies f1 and f2 as mentioned above, the first and the second motors 63 and 64 are controlled by a controller 65 and the first and the second speeds of rotation are monitored by first and second rotation detectors 66 and 67, respectively.

Accordingly, the first and the second disk members 56 and 57 are automatically controlled by the use of the controller 65 and the first and the second rotation detectors 66 and 67 so that the difference V between the rotational frequencies f1 and f2 becomes equal to the repetition frequency of the pulsed laser beam 30. As a result, the first and the second through holes 58 and 59 are aligned with the outlet 23 in synchronism with rotation of the first and the second disk members 56 and 57 and are opened relative to the outlet 23. Thus, the first and the second through holes 58 and 59 are periodically superposed on the outlet 23.

Under the circumstances, it is possible to determine an opening time of the X-ray gate unit 51 by selecting the first and the second rotational frequencies f1 and f2, the sizes of the first and the second through holes 58 and 59, and the distances between the axes of rotation and the first and the second through holes 58 and 59. Specifically, it is assumed that the first and the second through holes 58 and 59 have the areas of 1 cm$^2$ and are spaced apart from the axes of rotation by the distances between 5 cm and 10 cm and that the first and the second rotational frequencies f1 and f2 are equal to 600 Hz and 500 Hz, respectively. In this event, the opening time becomes 64 microseconds.

In the illustrated example, the laser pulses of the pulsed laser beam 30 have the repetition frequency of 100 Hz, namely, a repetition period of 10 milliseconds, and the pulse width of 10 nanoseconds. Therefore, it is readily understood that the above-mentioned opening time is very shorter than the repetition period of the laser pulses and is remarkably longer than the pulse width of the laser pulses.

Inasmuch as generation of the X-rays is synchronized with each of the laser pulses, the X-rays are passed through the X-ray gate unit 51 during the opening time of the X-ray gate unit 51.

The gaps between the chamber 11' and the first disk member 56 and between the first and the second disk members 56 and 57 may be between 1 and 2 millimeters. Since only extremely short gaps are left between the chamber 11' and the first disk member 56 and between the first and the second disk members 56 and 57, a degree of vacuum in the hollow space is kept substantially invariable. This shows that air is scarcely introduced or entered into the chamber 11' from an atmosphere. This serves to avoid an overload which might otherwise be imposed on the exhausting unit 25 and to readily carry out, in the cooling unit 41, recovery of the target material from an exhausted gas without any trouble.

According to the inventors' experimental studies, it has been confirmed that X-rays can be generated by bombarding the pulsed laser beam 30, if the target material has a density equal to or near to a solid. In other words, generation of X-rays is possible even by the use of a liquid having a density approximate to a solid.

Figure 6:
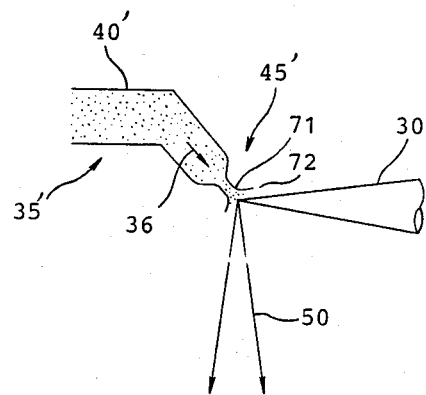
FIG. 6 is a partial view of a laser plasma X-ray device according to a second embodiment of this invention.

Referring to FIG. 6, a laser plasma X-ray device according to a second embodiment of this invention is similar in structure to that illustrated in FIG. 2 except for a target material supply unit 35' and a conveyor unit 45'. The illustrated conveyor unit 45' is directly connected to an end of a conduit 40' of the target material supply unit 35' and comprises a squeezed portion 71 and a flared exit portion 72 having a diameter greater than the squeezed portion 71.

The pulsed laser beam 30 is focused on the exit portion 72. In other words, the focal point of the pulsed laser beam 30 is adjusted to the exit portion 72.

With this structure, the target material of the liquid phase is pushed out of the exit portion 72 in the form of a succession of liquid drops after passage of the squeezed portion 71. Successive bombardment of each liquid drop is helpful to thermally isolate each liquid drop from a next following one of the liquid drops that is not bombarded yet. Accordingly, heat conduction scarcely takes place from each liquid drop to the next following liquid drop. This serves not only to reduce a heat loss but also to avoid objectionable heating and evaporation of the next following liquid drop which might otherwise be carried out before bombardment of the pulsed laser beam 30.

The heat loss can remarkably be reduced when each liquid drop is pushed out of the exit portion 72 in synchronism with the bombardment of the pulsed laser beam 30. Each liquid drop is successively bombarded one after another by the pulsed laser beam 30 to produce plasma and generate X-rays 50. A size of the liquid drops can be controlled by adjusting the squeezed portion 71 and the exit portion 72.

At any rate, the illustrated laser plasma X-ray device can be realized by the use of a usual cooling technique. For example, xenon has the liquefying point of minus 107.1° C. and the solidifying point of minus 111.9° C. Likewise, krypton has the liquefying point of minus 152.9° C. and the solidifying point of 156.6° C. Therefore, xenon and krypton can readily be liquefied and solidified by the use of liquid nitrogen having the liquefying point of minus 195.65° C.

Thus, the laser plasma X-ray device according to this invention can continuously supply a focal point of a pulsed laser beam with a target material of a liquid phase or a solid phase by the use of a target material supply unit and a conveyor unit. Accordingly, frequent exchange of a target becomes unnecessary, which results in improvement of performance of the device. Such continuous supply of the target material enables continuous and stable generation of X-rays.

In addition, the target material is never deposited on the wall of the chamber 11' because the target material is chemically stable or inactive and gasified by bombardment of the pulsed laser beam. The target material can be effectively recycled by recovering a gas phase of the target material.

Moreover, the X-ray gate unit 51 is opened in synchronism with generation of X-rays for an opening time longer than a pulse width of each laser pulse and allows the X-rays to pass therethrough without intervention of any thin film. Therefore, it is possible to sufficiently avoid attenuation of the X-rays and to generate the X-rays without a variation of intensity. In addition, a degree of vacuum can readily be kept invariable in the chamber. Therefore, the laser plasma X-ray device is practical and inexpensive.

While this invention has thus far been described in conjunction with a few embodiments thereof, it will readily be possible for those skilled in the art to put this invention into practice in various other manners For example, the first and the second disk members 56 and 57 may be placed within the chamber. A plurality of through holes may be formed in each of the first and the second disk members, if a degree of vacuum is kept invariable. Each through hole may have an optional contour. In this event, it is needless to say that a pulse width and a repetition frequency of the laser pulses should be selected in consideration of the number of the through holes. Alternatively, the X-ray gate unit may comprise a shutter member closed and opened in synchronism with the pulsed laser beam and a driving member for driving the shutter member.

What is claimed is:

1. In a laser plasma X-ray generator for generating X-rays by bombarding a target material by a pulsed laser beam, the improvement wherein said target material is in a gas phase at room temperature and is cyclically transformable between the gas phase, liquid phase, and solid phase, said generator comprising:
   a vacuum chamber defining a hollow space, said chamber including a laser inlet portion and an X-ray outlet portion;
   laser emitting means for emitting a pulsed laser beam into said hollow space through said laser inlet portion so that said pulsed laser beam converges at a predetermined focal point within said hollow space;
   target material supplying means for continuously supplying target material into said hollow space in a liquid phase;
   conveying means within said hollow space for continuously conveying said target material to said focal point and for transforming said target material into a solid phase on said conveying means, said target material being transformed into the gas phase at said focal point and thereby generating X-rays at said focal point under the application of said pulsed laser beam thereat;
   X-ray extracting means adjacent to said X-ray outlet portion for extracting said X-rays from said hollow space; and
   recovering means for recovering the target material in the gas phase from said hollow space to feed the same back to said target material supplying means for transformation into the liquid phase.

2. A laser plasma X-ray generator as claimed in claim 1, wherein said target material is an inert or rare gas.

3. A laser plasma X-ray generator as claimed in claim 1, wherein said conveying means comprises:
   an endless belt disposed within said hollow space in the vicinity of said target material supplying means such that said endless belt passes through said focal point, the target material being supplied to said endless belt and being transformed into the solid phase on said endless belt for conveyance to said focal point; and
   driving means mechanically coupled to said endless belt for continuously driving said endless belt to feed the target material in the solid phase to said focal point.

4. A laser plasma X-ray generator as claimed in claim 3, wherein said driving means comprises:
   a pair of rolls disposed within said hollow space in spaced relation and supporting said belt, and
   means for rotating said rolls to drive said endless belt.

5. A laser plasma X-ray generator as claimed in claim 1, wherein said target material supplying means comprises:
   a reservoir outside said hollow space for storing said target material in the liquid phase; and a conduit coupled to said reservoir for conducting said target material to said conveying means within said hollow space.

6. A laser plasma X-ray generator as claimed in claim 1, wherein said recovery means comprises:
   exhausting means coupled to said chamber for exhausting said target material in said gas phase from said hollow space; and
   recycling means coupled to said reservoir and said exhausting means for recycling the target material in said gas phase to said liquid phase.

7. A laser plasma X-ray generator as claimed in claim 1, said pulsed laser beam having a predetermined repetition frequency, said X-ray extracting means comprising:
   gating means adjacent to said X-ray outlet portion for gating said X-ray outlet portion in synchronism with said predetermined frequency of said pulsed laser beam to pass said X-rays outside of said hollow space.

8. A laser plasma X-ray generator as claimed in claim 7, wherein said gating means comprising:
   a first disk member having at least one first hole;
   a second disk member having at least one second hole which is related in number to said first hole;
   a first axle member rotatably supporting said first disk member so that said at least one first hole periodically faces said X-ray outlet portion;
   a second axle member rotatably supporting said second disk member with said first and said second disk members partially superposed on each other to periodically register said at least one second hole with said at least one first hole;
   first driving means coupled to said first axle member for driving said first axle member to rotate said first disk member at a first speed of rotation;
   second driving means coupled to said second axle member for driving said second axle member to rotate said second disk member at a second speed of rotation which is selected so that a difference between said first and said second speeds of rotation is substantially equal to said predetermined repetition frequency, said at least one first and said at least one second holes being thereby periodically opened relative to said X-ray outlet portion in synchronism with the generation of said X-rays.

9. A laser plasma X-ray generator as claimed in claim 8, wherein said predetermined pulse width of each laser pulse is substantially equal to an opening time during which said at least one first and said at least one second holes are superposed on each other.

10. A laser plasma X-ray generator as claimed in claim 8, wherein said first and said second disk members are adjacent to said X-ray outlet portion outside of said chamber.

11. A method of generating X-rays by bombarding a target material by a pulsed laser beam at a focal point thereof, said method comprising the steps of;
   providing a target material in a liquid phase by cooling a gas selected from the group consisting of inert gases and rare gases;
   guiding said target material in the liquid phase onto a conveyor belt to transform the target material from the liquid phase to a solid phase;
   continuously transporting said target material in said solid phase to said focal point; and
   directing said pulsed laser beam onto the target material in said solid phase to generate X-rays and transform said target material into a gas phase.

12. A method as claimed in claim 11 comprising recovering the target material which has been transformed into the gas phase, converting the target material back into the liquid phase and guiding the target material in liquid phase back to the conveyer belt.

* * * * *